United States Patent

Yun et al.

[11] Patent Number: 6,153,469
[45] Date of Patent: Nov. 28, 2000

[54] METHOD OF FABRICATING CELL OF FLASH MEMORY DEVICE

[75] Inventors: Jae-sun Yun, Chungju; Jeong-hyuk Choi, Suwon; Chan-jo Lee, Seoul, all of Rep. of Korea

[73] Assignee: Samsung Electronics, Co., Ltd., Suwon, Rep. of Korea

[21] Appl. No.: 09/352,448

[22] Filed: Jul. 13, 1999

Related U.S. Application Data

[60] Provisional application No. 60/092,553, Jul. 13, 1998.

[51] Int. Cl.[7] .................................................. H01L 21/336
[52] U.S. Cl. .......................... 438/257; 438/267; 438/211; 438/288; 438/263; 438/264; 438/574; 257/315; 257/316
[58] Field of Search .................................. 438/257, 267, 438/574, 211, 288, 263, 264; 257/316, 315

[56] References Cited

U.S. PATENT DOCUMENTS 5,661,053  8/1997  Yuan ........................................ 437/43
5,688,705  11/1997  Bergemont ............................... 437/43

*Primary Examiner*—Matthew Smith
*Assistant Examiner*—Belur Keshavan
*Attorney, Agent, or Firm*—Marger Johnson & McCollom, P.C.

[57] ABSTRACT

An improved method of fabricating a flash memory cell is disclosed. A tunnel oxide film is formed on active regions. A first conductive film and a protective film are sequentially formed on the tunnel oxide film. The protective film on the isolation film is selectively etched, thus forming a protective film pattern on the tunnel oxide film. A sacrificial conductive film is formed on the resultant structure. The sacrificial conductive film and the first conductive film pattern are over-etched until the sidewalls and the upper surface of the protective film pattern are exposed, thereby exposing the center of the isolation film and simultaneously forming a first conductive film pattern having sloped sidewalls. With the present invention, an electrical field is prevented from being concentrated in an area between a control gate electrode and a floating gate because the floating gate have a sloped sidewall profile instead of sharp edges. Also, the recession of an isolation film between adjacent floating gates can be significantly avoided, consequently suppressing the deterioration of isolation between adjacent cells.

21 Claims, 12 Drawing Sheets

METHOD OF FABRICATING CELL OF FLASH MEMORY DEVICE

This appln claims the benefit of U.S. Provisional No. 60/092,553, filed Jul. 13, 1998.

BACKGROUND OF THE INVENTION

1. Field of the Invention

The present invention relates to a method of fabricating a semiconductor memory device and, more particularly, to a method of fabricating a cell of a flash memory device.

2. Description of the Related Art

A flash memory device, among semiconductor memory devices, retains information stored in its memory cells even when no power is supplied. Accordingly, it has been used in various applications such as a flash memory card. A memory cell in which floating gate and control gate electrodes are sequentially stacked has been prevalently adopted as a unit cell of the flash memory device.

FIG. 1 is a cross-section of a unit cell of a conventional flash memory device.

Referring to FIG. 1, a source region S and a drain region D, isolated from each other and having a channel region therebetween, are formed on the surface of a semiconductor substrate 1, e.g., a p-type silicon substrate. The source and drain regions S and D are formed of a film doped with impurities of a different conductive type from the semiconductor substrate 1, i.e., an $N^+$-type impurity film. A thin tunnel oxide film 3 of 100 Å or less, a floating gate (FG), a dielectric film 5, and a control gate (CG) electrode are sequentially formed on the channel region.

The unit cell of FIG. 1 is programmed by applying a voltage of 5V to 7V to the drain region D and a voltage of 10V to 12V to the control gate electrode CG. At this time, 0V is applied to the source region S and the semiconductor substrate 1. When appropriate voltages are applied to the control gate electrode CG, the source region S, the drain region D and the semiconductor substrate 1 to program the unit cell as described above, hot carriers generated by the channel region, i.e., channel hot electrons, pass through the tunnel oxide film 3 and are injected into the floating gate FG. Consequently, the programming is accomplished by increasing a threshold voltage of the unit cell shown in FIG. 1.

Also, an erasure operation is performed by grounding the control gate electrode CG and the semiconductor substrate 1 and applying a high voltage of between 12V and 15V to the source region S. At this time, the drain region D is floated. When appropriate voltages are applied to the control gate electrode CG, the source region S, the drain region D and the semiconductor substrate 1 to erase the information stored in the unit cell as described above, electrons, stored in the floating gate FG, pass through the tunnel oxide film 3 and reach the source region S because of the voltage difference between the floating gate FG and the source region S. Accordingly, all of the electrons in the floating gate FG are removed. Consequently, the erasure operation is accomplished while allowing the unit cell to have an initial threshold voltage or less.

FIG. 2 is an equivalent circuit diagram illustrating a capacitive coupling ratio of the unit cell shown in FIG. 1.

Referring to FIG. 2, a capacitance $C_{ipo}$ caused by the dielectric film 5 of FIG. 1 exists between the control gate electrode CG and the floating gate FG, and a capacitance $C_{ch}$ caused by the tunnel oxide film 3 of FIG. 1 exists between the floating gate FG and the semiconductor substrate 1, i.e., the channel region. Also, a capacitance $C_s$ caused by the tunnel oxide film 3 of FIG. 1 exists between the floating gate FG and the source region S, and a capacitance $C_d$ caused by the tunnel oxide film 3 of FIG. 1 exists between the floating gate FG and the drain region D. When a voltage $V_{CG}$ and a voltage $V_d 0$ are applied respectively to the control gate electrode CG and the drain region D, and 0V is applied to both the source region S and the semiconductor substrate 1, in order to program the unit cell, a voltage $V_{FG1}$ induced to the floating gate FG is expressed by the following Equation 1:

$$V_{FG1} = [C_{ipo} \div (C_{ipo} + C_d + C_{ch} + C_s)] \times V_{CG}$$

Also, when the control gate electrode CG and the semiconductor substrate 1 are grounded and a voltage $V_S$ is applied to the source region S with the drain region D floated, in order to erase information stored in the unit cell of FIGS. 1 and 2, a voltage $V_{FG2}$ induced to the floating gate FG is expressed by the following Equation 2:

$$V_{FG2} = [C_s \div (C_{ch} + C_{ipo} + C_s)] \times V_s$$

It can be seen from Equations 1 and 2 that program efficiency and erase efficiency are increased by increasing the capacitance $C_{ipo}$. This is because the voltage $V_{FG1}$ induced to the floating gate FG during programming approaches the control gate voltage $V_{CG}$ and the voltage $V_{FG2}$ induced to the floating gate FG during erasing approaches a ground potential, with an increase in capacitance $C_{ipo}$. Thus, the capacitance $C_{ipo}$ between the floating gate and the control gate electrode must be increased to improve the characteristics of the unit cell of the flash memory device.

FIG. 3 is an equivalent circuit diagram of a portion of a cell array region of a conventional NOR-type flash memory device adopting the unit cell of FIG. 1.

Referring to FIG. 3, a plurality of bit lines B/L1, B/L2 are parallel to each other, and a plurality of unit cells are connected respectively to the bit lines. Also, a plurality of word lines W/L1 and W/L2 cross the plurality of bit lines B/L1 and B/L2, and each word line is electrically connected to the control gate electrode of the unit cell. Here, a pair of cells connected to one bit line in parallel share one source region. The source region is connected to a common source line C/S which is parallel to the word lines.

In order to program a cell C1 of FIG. 3, a program voltage, e.g., a voltage between 10V and 12V, is applied to the first word line W/L1, and a voltage between 5V and 7V is applied to the first bit line B/L1. Also, the second word line W/L2 and the common source line C/S are grounded. Here, when the cell C1 is selected from the cells C1 and C2 sharing the first bit line B/L1 and then programmed, a voltage $V_{FG3}$ induced to the floating gate of the cell C2 is expressed by the following Equation 3:

$$V_{FG3} = [C_d \div (C_{ch} + C_{ipo} + C_s C_d)] \times V_d$$

wherein $V_d$ denotes a voltage applied to a drain region of the cell C2, i.e., a voltage applied to the first bit line B/L1.

As can be seen from Equation 3, when the cell C1 is programmed, the voltage $V_{FG3}$ is induced to the floating gate of the cell C2. $V_{FG}3$ is proportional to the drain voltage $V_d$, and approaches the drain voltage $V_d$ as the capacitance $C_{ipo}$ becomes small. Accordingly, when the capacitance $C_{ipo}$ decreases, the unselected cell C2 is turned on and disturbs the programming on the selected cell C1, which is called a drain turn-on phenomenon. As a result, in order to increase programming efficiency of a desired cell, the drain turn-on phenomenon must be suppressed by increasing the capacitance $C_{ipo}$.

FIG. 4 is a layout view of a portion of a cell array region to realize the equivalent circuit diagram shown in FIG. 3.

Referring to FIG. 4, a plurality of word line patterns 15 are parallel to each other, and an active region pattern 11 crosses the word line patterns 15. A common source region pattern S extending from the active region pattern 11 is disposed in parallel to and between the word line patterns 15. The active region pattern 11, opposing the common source region pattern S having the word line pattern 15 therebetween, corresponds to a drain region D of a cell. A bit line contact pattern 17 is disposed in each of the drain regions D, and a bit line pattern 19 covering the bit line contact pattern 17 is perpendicular to the word line pattern 15. Also, an etch mask pattern 13, for isolating the floating gates of adjacent cells in the direction of the word line patterns 15, is placed between the bit line patterns 19.

FIGS. 5 through 8 are cross-sections of FIG. 4 taken along line B-B', illustrating a method of fabricating a cell of a flash memory device disclosed in U.S. Pat. No. 5,675,162.

Referring to FIG. 5, a field oxide film 23 for defining active and inactive regions is formed in a predetermined region of a semiconductor substrate 21. A tunnel oxide film 25 is formed on the surface of the active region. A first doped polysilicon film 27 and a silicon nitride film 29 are sequentially formed on the entire surface of the semiconductor substrate on which the tunnel oxide film 25 is formed. A photoresist pattern 31 is formed on the silicon nitride film 29, using a photomask on which the etch mask pattern 13 of FIG. 4 is drawn.

Referring to FIG. 6, the silicon nitride film 29 is etched until the first doped polysilicon film 27 is exposed, using the photoresist pattern 31 as an etch mask, thereby forming a silicon nitride film pattern 29 covering the upper portion of the active region. A second doped polysilicon film 33 is formed on the entire surface of the semiconductor substrate on which the silicon nitride film pattern 29 is formed.

Referring to FIG. 7, a spacer 33' is formed on the sidewalls of the silicon nitride film pattern 29 by anisotropically etching the second doped polysilicon film 33. Then, the first doped polysilicon film 27 is etched by using the silicon nitride film pattern 29 as an etch mask, thus forming a first doped polysilicon film pattern 27.

Referring to FIG. 8, the first doped polysilicon film pattern 27 is exposed by removing the silicon nitride film pattern 29. Then, an insulating film 35, such as an oxide/nitride/oxide (O/N/O) film, and a third polysilicon film 37 are sequentially formed on the entire surface of the semiconductor substrate from which the silicon nitride film pattern 29 has been removed. The third polysilicon film 37, the insulating film 35, and the first doped polysilicon film pattern 27 are continuously etched by using a photomask on which the word line pattern 15 of FIG. 4 is drawn, thereby forming a floating gate 27 and a control gate electrode 37.

In the above-described U.S. Pat. No. 5,675,162, the gap between adjacent floating gates is made smaller than a resolution limit of photolithography, to maximize the area where a floating gate overlaps with a control gate electrode. Also, a spacer formed of a second doped polysilicon film remains on the edge of the floating gate. Accordingly, the capacitance between the floating gate and the control gate electrode can be maximized. However, according to the U.S. Pat. No. 5,675,162, when a high voltage is applied to the control gate electrode, a strong electrical field is concentrated between the spacer and the control gate electrode since the spacer has sharp upper edges. Hence, the reliability and breakdown voltage of an insulating film interposed between the floating gate and the control gate electrode are degraded.

SUMMARY OF THE INVENTION

To solve the above problems, it is an object of the present invention to provide a method of fabricating a cell of a flash memory device, whereby the reliability of an interlayer insulating film between a floating gate and a control gate electrode can be improved.

It is another object of the present invention to provide a method of fabricating a cell of a flash memory device, whereby a recessed area of an isolation film between adjacent floating gates can be made much shallower by forming a sloped sidewall profile of a floating gate.

To accomplish the above objects of the present invention, according to one aspect of the present invention, a tunnel oxide film, a semiconductor film, a protective film and a first conductive film are sequentially formed on active regions of a semiconductor substrate. It is preferable that the tunnel oxide film is a thin thermal oxide film of 100 Å or less; the semiconductor film is an undoped polysilicon film; and the first conductive film is a doped polysilicon film. Also, the protection film is preferably an insulative film containing a nitrogen component, e.g., a silicon nitride film or a silicon oxynitride film.

First conductive film patterns are formed at predetermined intervals by patterning the first conductive film. A spacer material film is formed on the entire surface of the semiconductor substrate on which the first conductive patterns are formed. It is preferable that the spacer material film is a doped silicon film or a silicon nitride film. The doped silicon film can be a doped polysilicon film or a doped amorphous silicon film.

A spacer is formed on the sidewalls of the first conductive film pattern, by anisotropically etching the spacer material film. Adjacent protective film patterns are formed with an intervening gap narrower than the resolution limit of the photolithography, by etching the protective film using the first conductive film patterns and the spacers as an etch mask. Semiconductor film patterns are formed by etching the semiconductor film exposed between the protective film patterns. Here, if the spacer is a doped silicon film and the first conductive film is a doped polysilicon film thinner than or equal to the semiconductor film, the first conductive film pattern and the spacer are both removed to expose the protective film pattern. On the other hand, if the spacer is formed of a silicon nitride film, the spacer remains on the edge of the protective film pattern.

Then, the semiconductor film pattern is exposed by removing the exposed protective film pattern by wet etching using a predetermined chemical solution, e.g., a phosphoric acid solution. The semiconductor film pattern is then doped by implanting impurity ions into the exposed semiconductor film pattern. The step of implanting the impurity ions into the semiconductor film pattern can be performed before removing the protective film pattern. However, it is more preferable that the impurity ions are implanted after the protective film pattern is removed, in order to implant the impurity ions at lower energy and improve doping uniformity.

An interlayer insulative film and a second conductive film are sequentially formed on the entire surface of the semiconductor substrate on which the impurity ion implantation process was performed. The second conductive film is a doped polysilicon film or a polycide film containing a refractory metal. The second conductive film, the interlayer insulative film, and the doped semiconductor film pattern are consecutively patterned, thereby forming a floating gate covering a predetermined region of the tunnel oxide film, an interlayer insulative film pattern overlying the upper portion of the floating gate, and a word line for use as a control gate electrode.

To accomplish the above objects of the present invention, according to another aspect of the present invention, an isolation film for defining a plurality of parallel active regions is formed on a semiconductor substrate. A tunnel oxide film is formed on the active regions. A first conductive film and a protective film are sequentially formed on the entire surface of the semiconductor substrate on which the tunnel oxide film is formed. The first conductive film is a doped silicon film or an undoped silicon film. Also, it is preferable that the protective film is a silicon nitride film. The protective film on the isolation film is selectively etched, thus forming a protective film pattern on the tunnel oxide film. A sacrificial conductive film, preferably, formed of the same material as the first conductive film, is formed on the entire surface of the resultant structure on which the protective film pattern is formed. The sacrificial conductive film and the first conductive film pattern are over-etched until the sidewalls and the upper surface of the protective film pattern are exposed, thereby exposing the center of the isolation film and simultaneously forming a first conductive film pattern having sloped sidewalls.

Meanwhile, when the first conductive film is an undoped silicon film, the protective film pattern is removed, and the first conductive film pattern is then doped. A process for doping the first conductive film pattern can be performed using an ion-implantation method before the protective film pattern is removed. An interlayer insulative film and a second conductive film are sequentially formed on the entire surface of the resultant structure with the protective film pattern removed. The second conductive film, the interlayer insulative film, and the first conductive film pattern are sequentially patterned, thereby forming a second conductive film pattern crossing the isolation film and simultaneously forming a first insulated conductive film pattern on a predetermined area of the tunnel oxide film. Here, the second conductive film pattern corresponds to a control gate electrode, that is, a word line, and the first insulated conductive film pattern corresponds to a floating gate.

According to the present invention, the interval between adjacent floating gates is made smaller than the resolution limit of the photolithography, such that the surface areas of the floating gates are maximized, and an electrical field is prevented from being concentrated in a specific area between a control gate electrode and a floating gate. This is because the floating gates have a sloped sidewall profile instead of sharp edges. Also, over-etching of interlayer insulative film portions formed on the sloped sidewalls of the floating gates is not required during a patterning process for forming the control gate electrode and the floating gates. Therefore, the recession of an isolation film between adjacent floating gates can be significantly reduced, consequently suppressing the deterioration of isolation between adjacent cells.

BRIEF DESCRIPTION OF THE DRAWINGS

The above objects and advantages of the present invention will become more apparent by describing in detail preferred embodiments thereof with reference to the attached drawings in which:

FIGS. 9A through 14A are cross-sections taken along line AA' of FIG. 4, illustrating a method of fabricating a flash memory cell according to one embodiment of the present invention;

FIGS. 9B through 14B are cross-sections taken along line BB' of FIG. 4, illustrating a method of fabricating a flash memory cell according to one embodiment of the present invention;

DESCRIPTION OF THE PREFERRED EMBODIMENT

Figure 1:
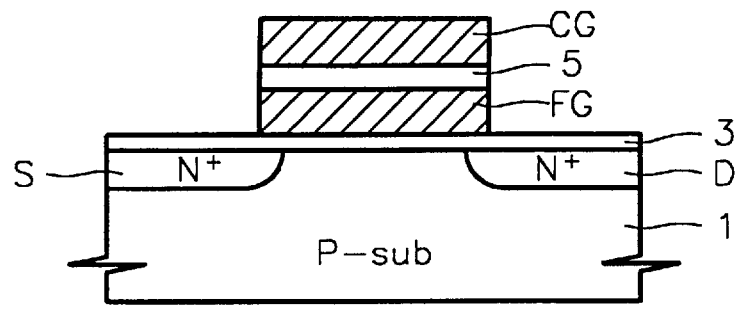
FIG. 1 is a cross-section of a unit cell used in the present invention and the prior art.
Figure 2:
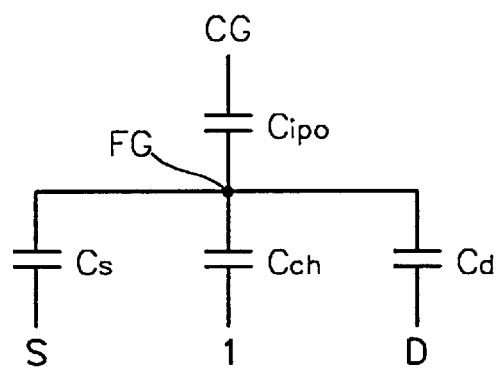
FIG. 2 is an equivalent circuit diagram illustrating a capacitive coupling ratio of the unit cell shown in FIG. 1.
Figure 3:
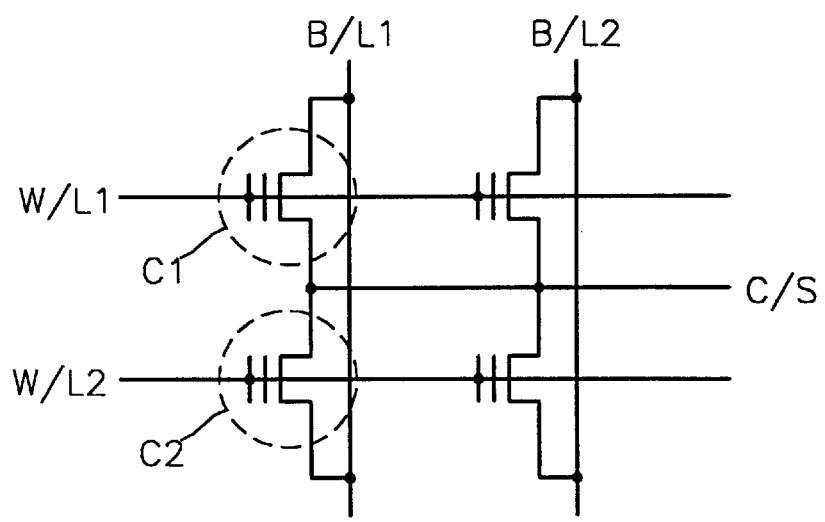
FIG. 3 is an equivalent circuit diagram illustrating a portion of a cell array region of a NOR-type flash memory device where the unit cells shown in FIG. 1 are two-dimensionally arrayed.
Figure 4:
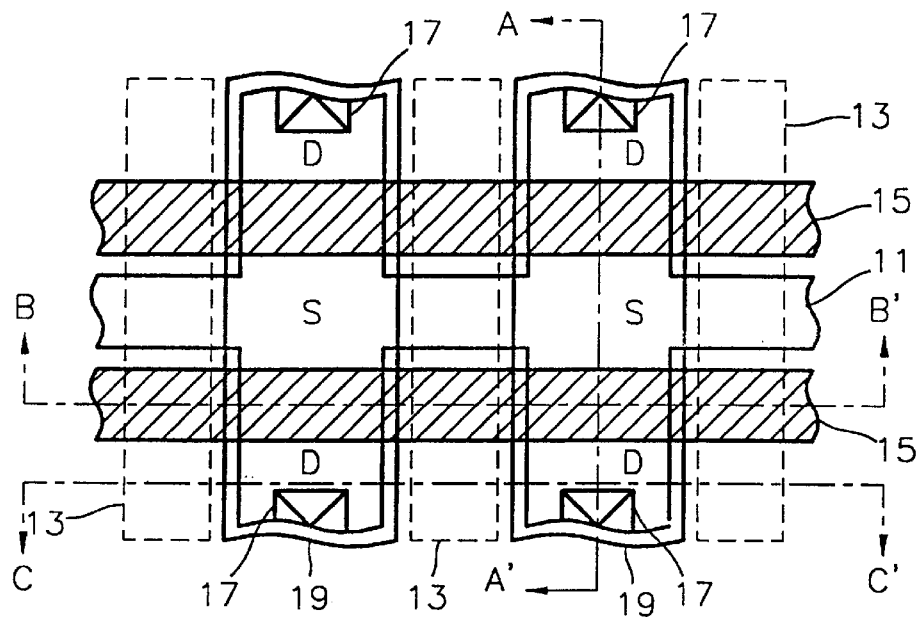
FIG. 4 is a layout view illustrating a portion of the cell array region having the equivalent circuit diagram of FIG. 3.
Figure 5:
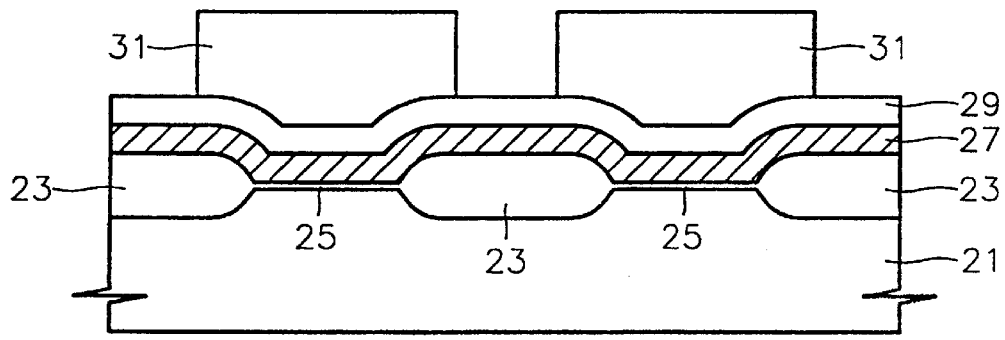
FIGS. 5 through 8 are cross-sections, taken along line BB' of FIG. 4, illustrating a conventional method of fabricating a flash memory cell.
Figure 6:
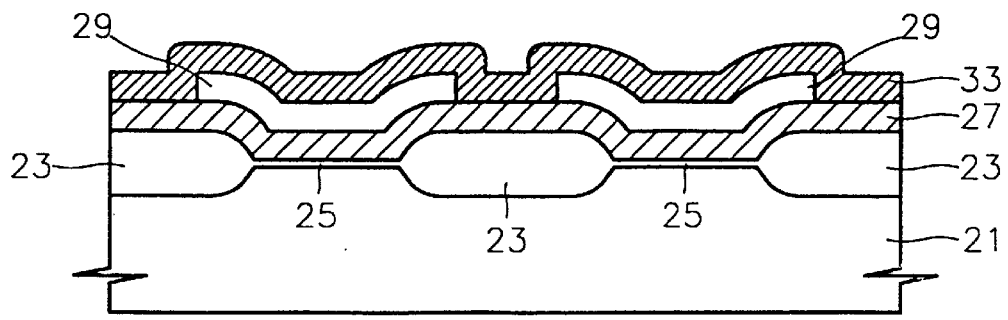
Figure 7:
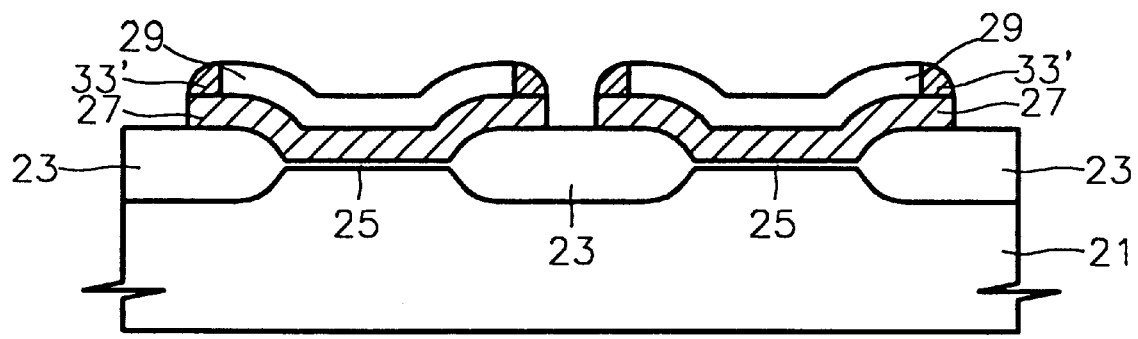
Figure 8:
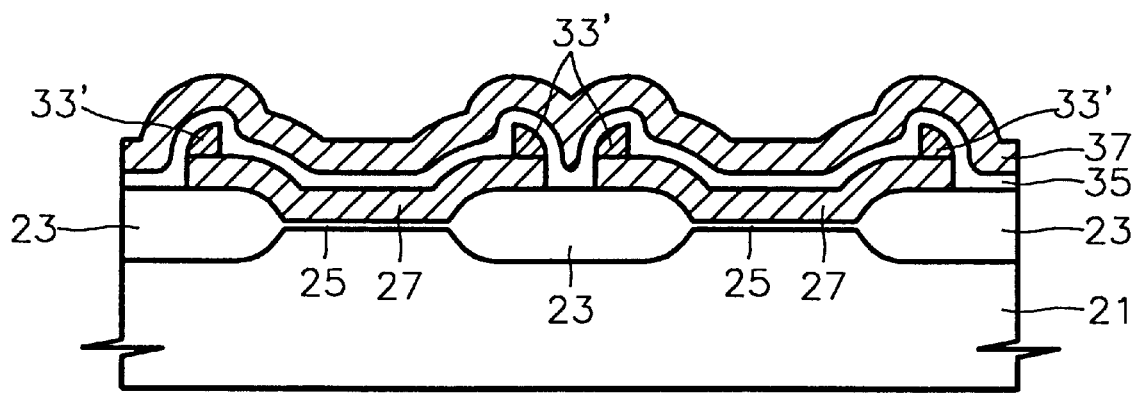
Figure 9A:
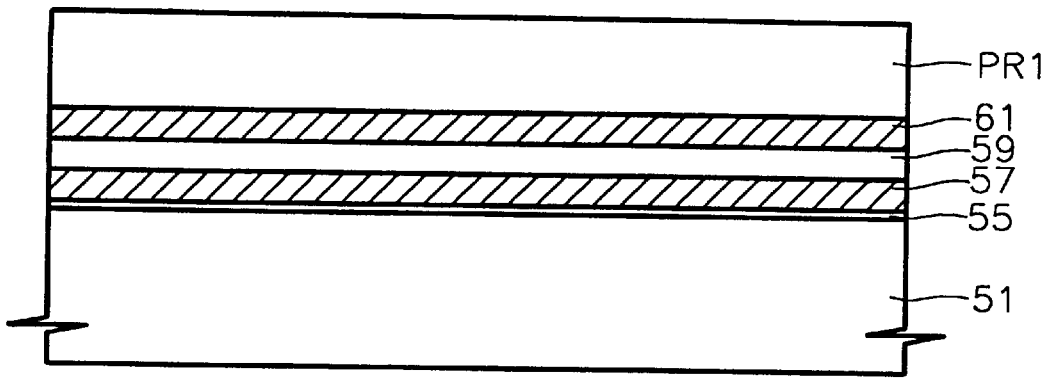
Figure 9B:
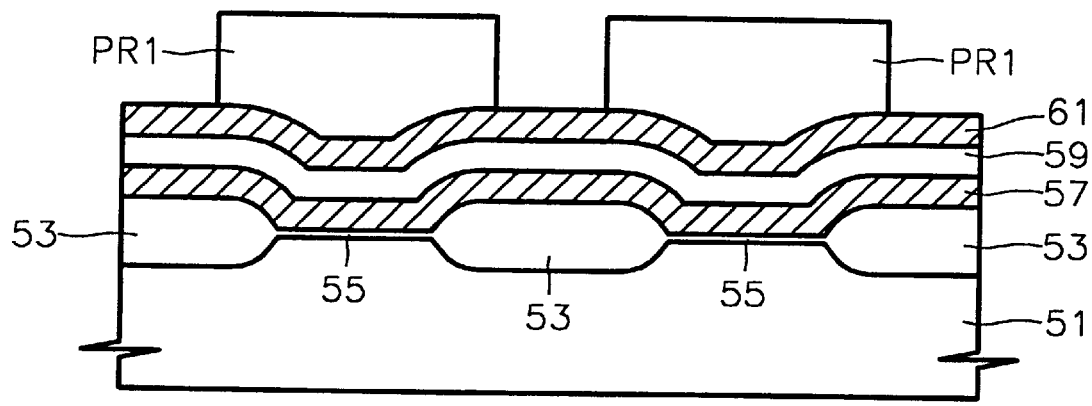

Referring to FIGS. 9A and 9B, an isolation film 53 for defining parallel active regions is formed on a semiconductor substrate, e.g., a P-type silicon substrate 51, using a photomask on which the active region pattern 11 of FIG. 4 is drawn. A thin tunnel oxide film 55 of 50 Å to 100 Å is formed on the active region. It is preferable that the tunnel oxide film 55 is a thermal oxide film. A semiconductor film 57 of about 1000 Å, a protective film 59 of about 500 Å, and a first conductive film 61 of about 1000 Å are sequentially formed on the entire surface of the semiconductor substrate on which the tunnel oxide film 55 is formed. The semiconductor film 57 is preferably an undoped polysilicon film, and first conductive film 61 is preferably a doped polysilicon film. The protective film 59 is preferably formed of a material having a high etch selectivity with respect to the semiconductor film 57 and the first conductive film 61. For example, it is preferable that the protective film 59 is an insulative film containing nitrogen, e.g., a silicon nitride film or a silicon oxynitride film. Preferably, the first conductive film 61 is the same thickness or thinner than the semiconductor film 57. A first photoresist film is coated on the first conductive film 61, and the first photoresist film is patterned by a photolithography process using a photomask on which the etch mask pattern 13 of FIG. 4 is drawn, thereby forming a first photoresist pattern PR1. As shown in FIGS. 9A and 9B, the first photoresist pattern PR1 is formed above the tunnel oxide film 55.

Figure 10A:
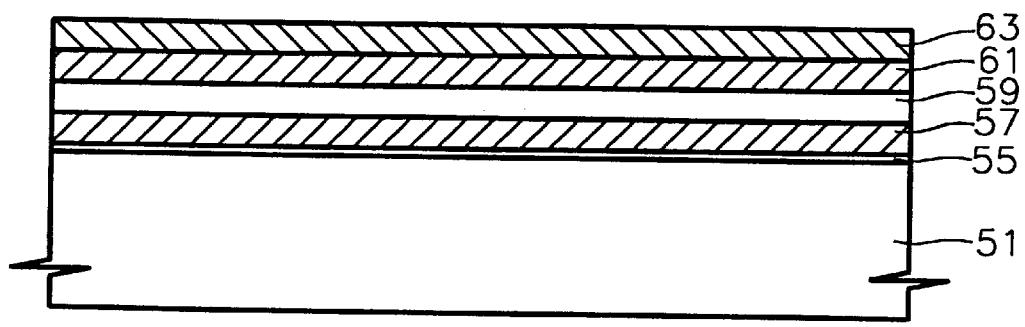
Figure 10B:
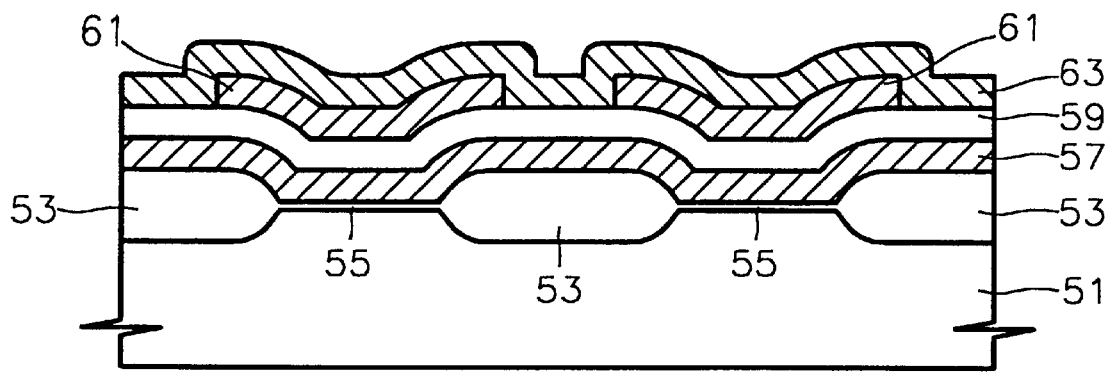

Referring to FIGS. 10A and 10B, the first conductive film 61 is etched using the first photoresist pattern PR1 as an etch mask, thus forming a first conductive film pattern 61 above the tunnel oxide film 55. After the first conductive film pattern 61 is formed, the first photoresist pattern PR1 is removed. A spacer material film 63 is formed on the entire surface of the semiconductor substrate from which the first photoresist pattern PR1 was removed. The spacer material film 63 is a doped silicon film or a silicon nitride film. Here, it is preferable that the doped silicon film is a polysilicon or amorphous silicon film. When the spacer material film 63 is formed of amorphous silicon, a spacer can be formed to a more uniform width during a subsequent anisotropic etching process.

Figure 11A:
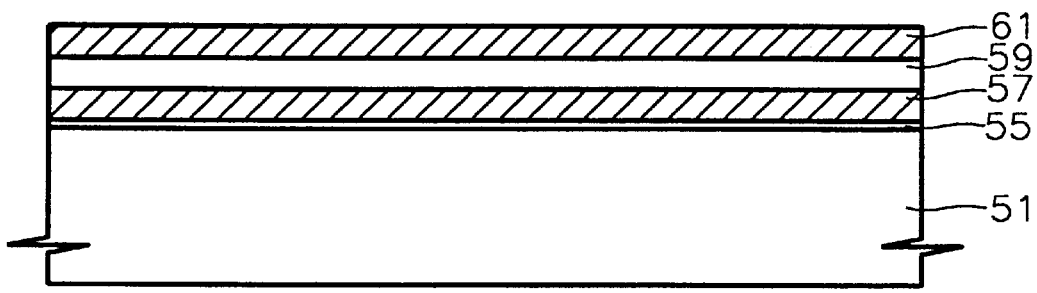
Figure 11B:
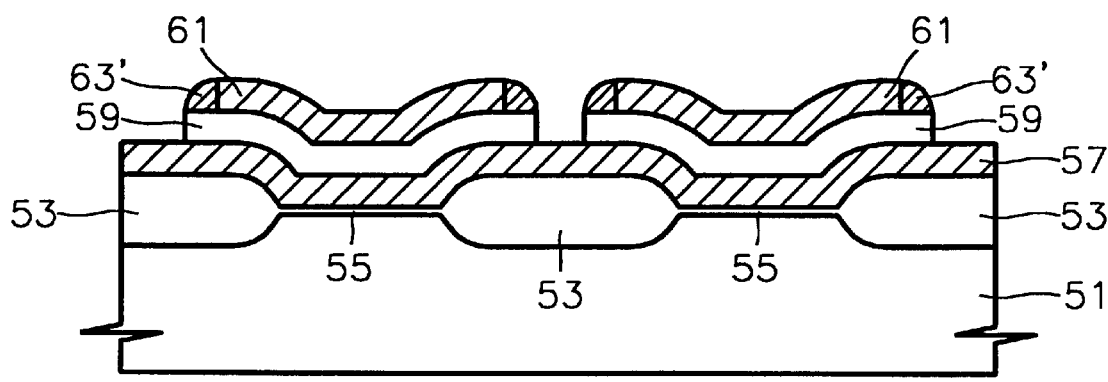

Referring to FIGS. 11A and 11B, spacers 63' are formed on the sidewalls of the first conductive film pattern 61 by anisotropically etching the spacer material film 63. At this time, the protective film 59 is exposed between the spacers 63'. Then, the semiconductor film 57 on the isolation film 53 is exposed by etching the exposed protective film 59. At this time, when the spacer 63' is a silicon nitride film, a portion of the spacer 63' is also etched, and the spacer 63' becomes smaller. Accordingly, a protective film pattern 59 having sloped sidewalls can be formed. However, when the spacer 63' is a doped silicon film, the size of the spacer 63' hardly changes. As described above, when the protective film is etched using the spacers 63' as an etch mask, the gap between the adjacent protective film patterns 59 is narrower than original gap formed between the first photoresist patterns PR1. That is, the gap between the protective film patterns 59 can be smaller than the photolithography resolution limit.

Figure 12A:
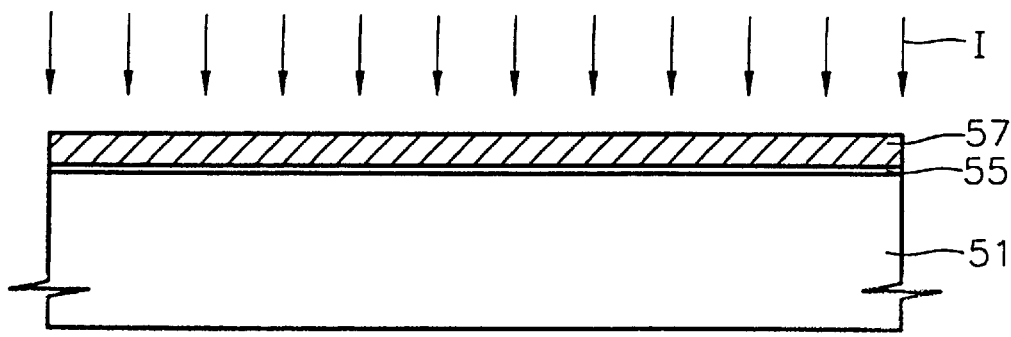
Figure 12B:
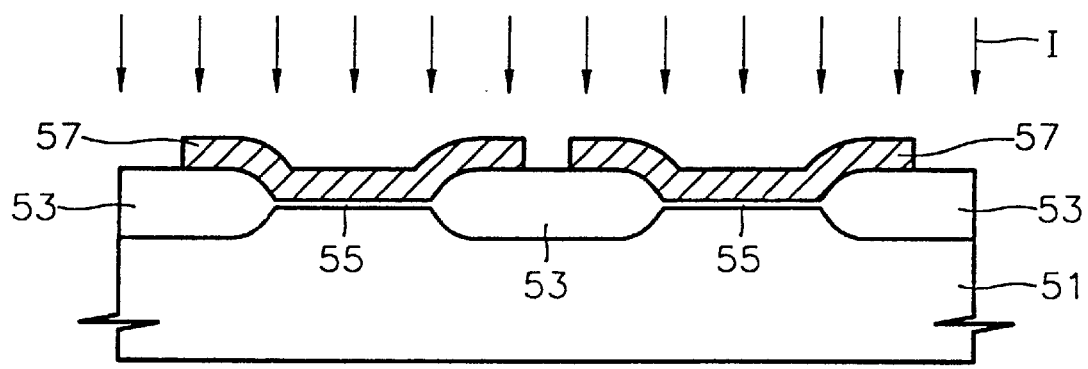

Referring to FIGS. 12A and 12B, the semiconductor film 57 exposed between the spacers 63' is etched, thus exposing the center of the isolation film 53 and simultaneously forming semiconductor film patterns 57 covering the tunnel oxide film 55. At this time, the first conductive film pattern 61 is also etched, and the protective film pattern 59 is thus exposed. When the spacer 63' is formed of doped silicon, it is also etched and removed. However, when the spacer 63' is formed of silicon nitride, it remains on the edge of the protective film pattern 59, and it is easy to form the semiconductor film pattern 57 to allow its sidewalls to have a positive sloped profile. This is because, as shown in FIGS. 11A and 11B, when the spacer 63' is a silicon nitride film, the sidewalls of the protective film pattern 59 are sloped. If the sidewalls of the semiconductor film pattern 57 have positive sloped profiles, a second conductive film, to be formed in a subsequent process, can be formed to fill the gap between adjacent semiconductor film patterns 57 without forming voids. The exposed protective film pattern 59 is removed by a chemical solution, e.g., a phosphoric acid solution, to expose the semiconductor film pattern 57. If the spacer 63', is formed of silicon nitride and remains on the edge of the protective film pattern 59, the spacer 63' is removed together with the protective film pattern 59. The semiconductor film pattern 57 is doped by implanting impurity ions I, e.g., arsenic (As) ions at an energy of 50 KeV and a dose of $2.0 \times 10^{15}$ ion atoms/cm$^2$. This ion implantation process for doping the semiconductor film pattern 57 may be performed before removing the protective film pattern 59. In that case, ion implantation energy must be higher than 50 KeV in consideration of the thickness of the protective film pattern 59.

Figure 13A:
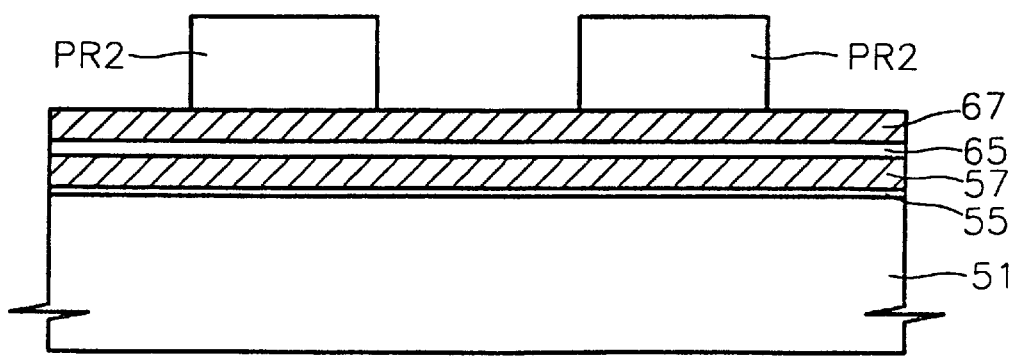
Figure 13B:
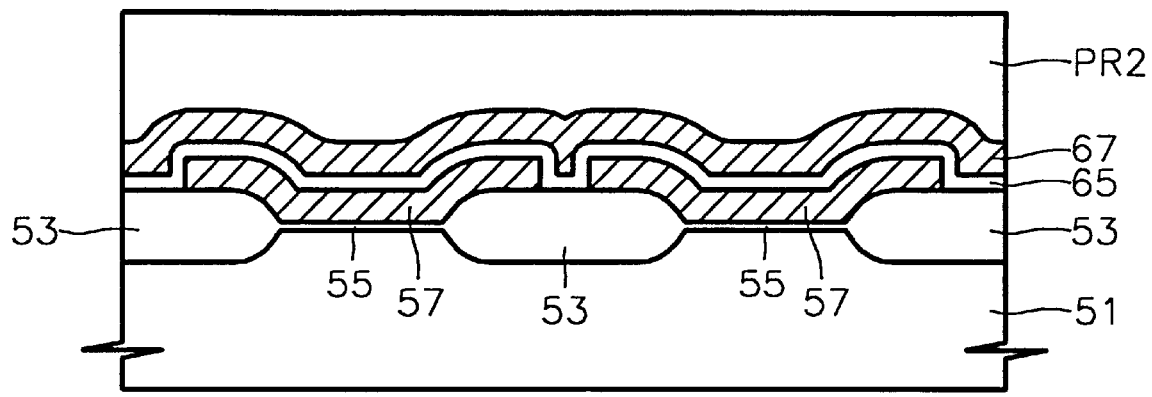

Referring to FIGS. 13A and 13B, an interlayer insulative film 65 and a second conductive film 67 are sequentially formed on the entire surface of a semiconductor substrate with the doped semiconductor film pattern 57. It is preferable that the interlayer insulative film 65 comprises a material film having a higher dielectric constant than that of an oxide film, e.g., a silicon nitride film. For example, it is preferable that the interlayer insulative film 65 is an O/N/O film or an N/O film. The second conductive film 67 is a doped polysilicon film. The second conductive film 67 can be a material film having excellent conductivity, e.g., a polycide film containing a refractory metal, instead of a doped polysilicon film. Specifically, the polycide film can be a tungsten or titanium polycide film. When the interlayer insulative film 65 and the second conductive film 67 are formed on the entire surface of the resultant structure on which the semiconductor film pattern 57 doped as described above is formed, the characteristics of the interface between the interlayer insulative film 65 and the doped semiconductor film pattern 57 can be improved because of an excellent surface morphology of the doped semiconductor film 57. Then, a second photoresist film is coated on the second conductive film 67. The second photoresist film is patterned by photolithography using a photomask on which the word line pattern 15 of FIG. 4 is drawn, thereby forming second photoresist patterns PR2 which cross the active region.

Figure 14A:
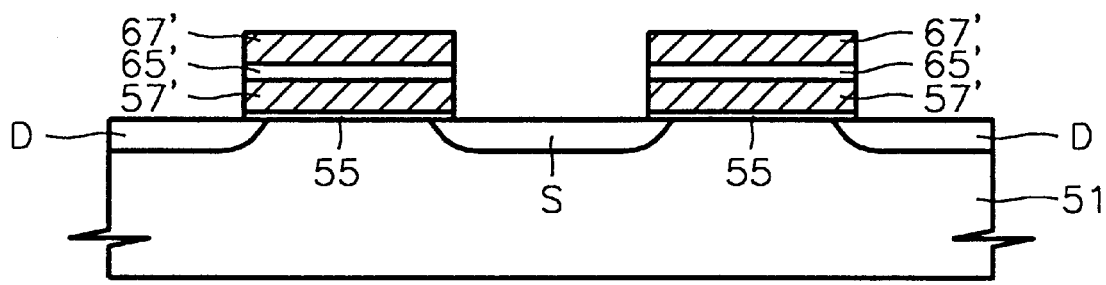
Figure 14B:
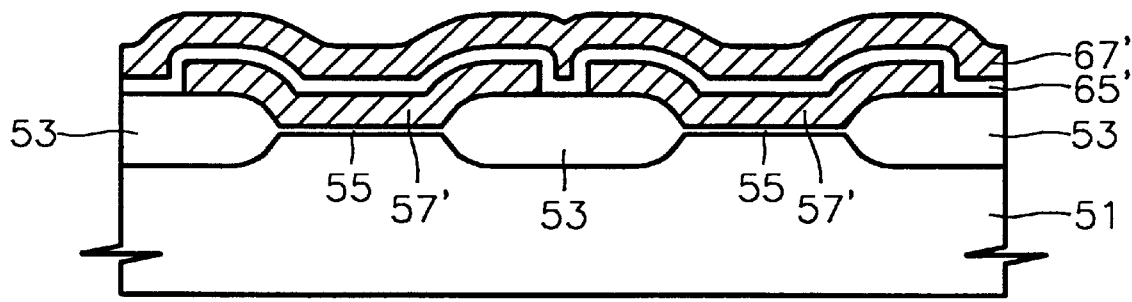

Referring to FIGS. 14A and 14B, the second conductive film 67, the interlayer insulative film 65, and the doped semiconductor film pattern 57 are sequentially etched using the second photoresist pattern PR2 as an etch mask, thus forming a floating gate 57', an interlayer insulative film pattern 65', and a word line 67' for use as a control gate electrode. The second photoresist pattern PR2 is removed. Impurity ions having a different conductive type from the semiconductor substrate 51, e.g., N-type impurity ions, are implanted into the active regions at both sides of the floating gate 57', thus forming a source region S and a drain region D.

Figure 15A:
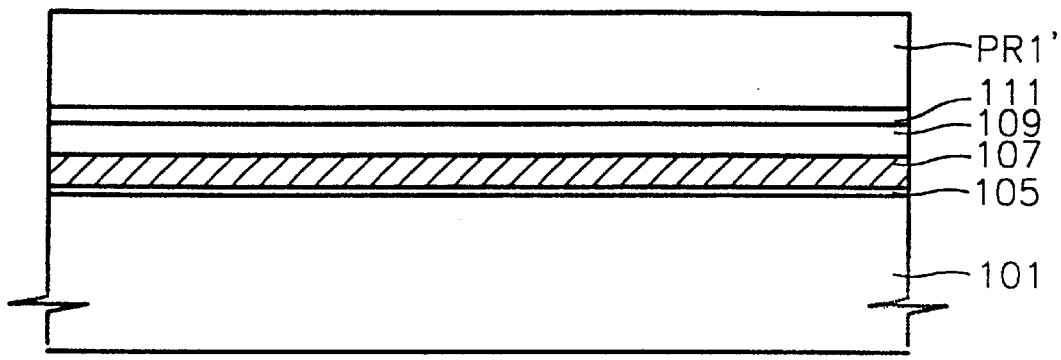
FIGS. 15A, 16A, 17A, 18A and 19A are cross-sections taken along line AA' of FIG. 4, illustrating a method of fabricating a memory cell according to another embodiment of the present invention.
Figure 15B:
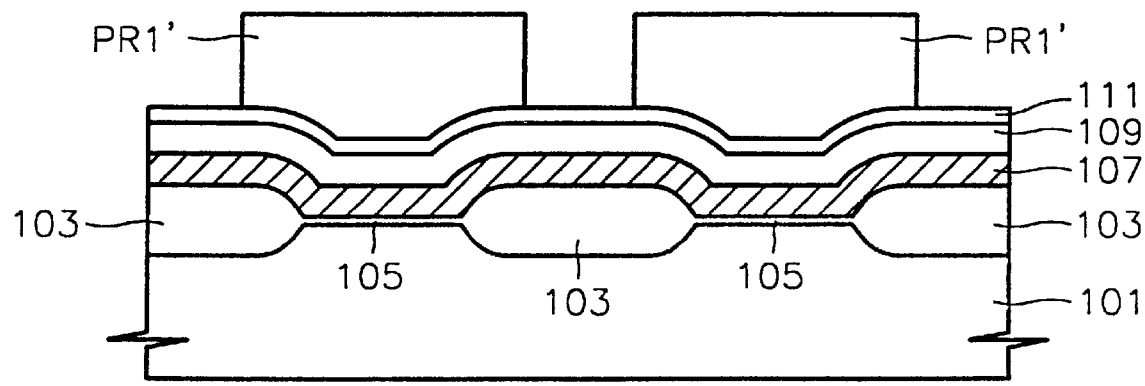
FIGS. 15B, 16B, 17B, 18B and 19B are cross-sections taken along line BB' of FIG. 4, illustrating a method of fabricating a memory cell according to another embodiment of the present invention.
Figure 15C:
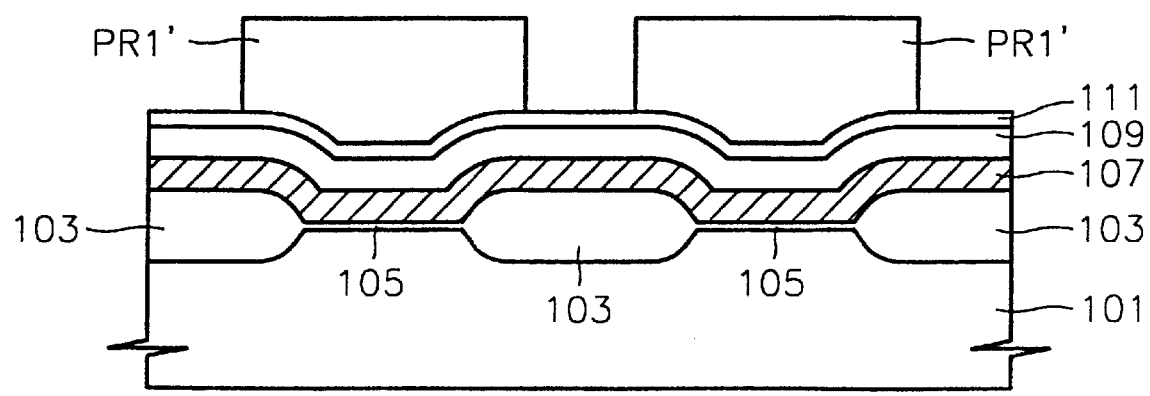
FIGS. 15C, 16C, 17C, 18C and 19C are cross-sections taken along line CC' of FIG. 4, illustrating a method of fabricating a memory cell according to another embodiment of the present invention.

Referring to FIGS. 15A, 15B and 15C, an isolation film 103 is formed on a predetermined region of a semiconductor substrate 101 by the same method as that in the first embodiment of the present invention, and a tunnel oxide film 105 is formed on an active region between the isolation films 103. A first conductive film 107 with a thickness of about 1000 to 2000 Å and a protective film 109 with a thickness of about 1000 Å are sequentially formed on the entire surface of the semiconductor substrate on which the tunnel oxide film 105 is formed. It is preferable that the first conductive film 107 is a doped silicon film or an undoped silicon film. The protective film 109 is preferably a material film having a high etch selectivity with respect to the oxide film and the silicon film. For example, it is preferable that the protective film 109 is a silicon nitride film. An anti-reflective film 111 having a thickness of 200 to 300 Å can be further formed on the protective film 109. Preferably, the anti-reflective film 111 is a silicon oxynitride film.

A first photoresist pattern PR1' is formed on the anti-reflective film 111 by the same method as that used in the first embodiment of the present invention.

Figure 16A:
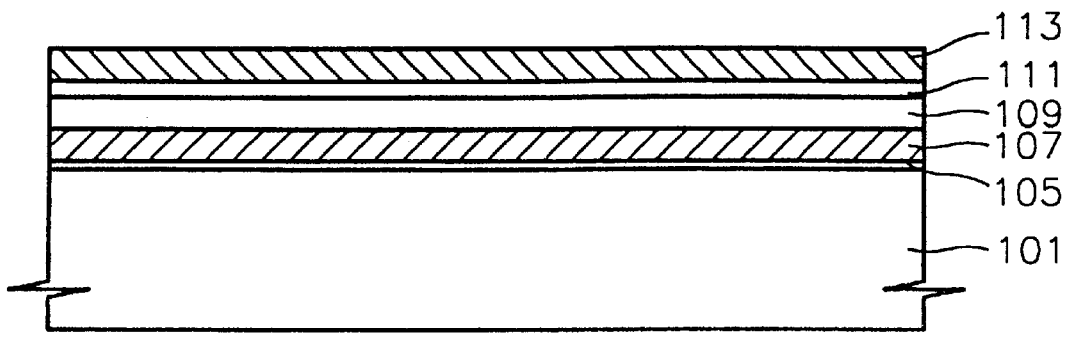
Figure 16B:
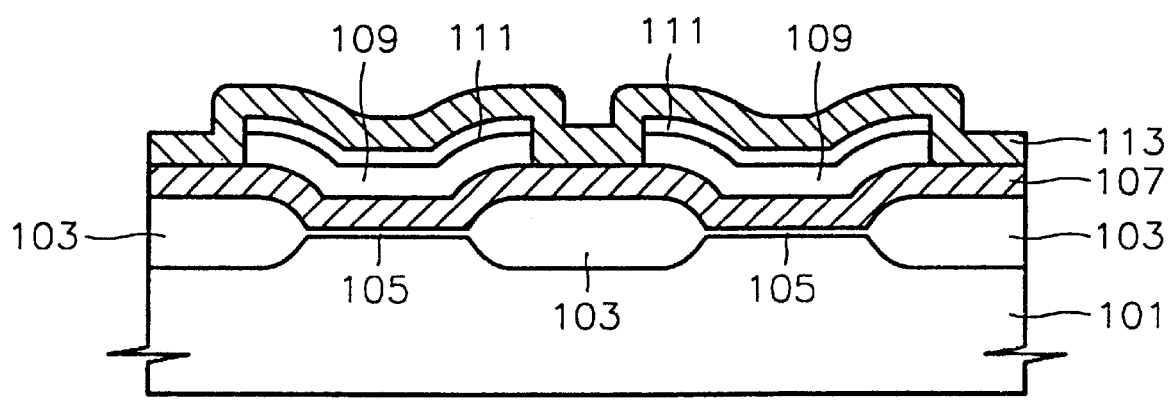
Figure 16C:
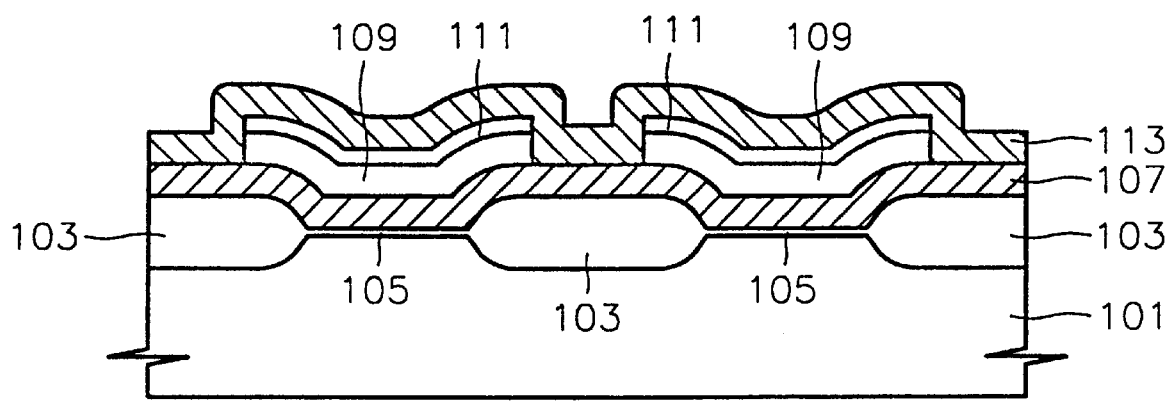

Referring to FIGS. 16A, 16B and 16C, the anti-reflection film 111 and the protective film 109 are etched using the first photoresist pattern PR1' as an etch mask, thus forming an anti-reflective film pattern 111 and a protective film pattern 109. The first photoresist pattern PR1' is then removed. A sacrificial conductive film 113 is formed on the entire surface of the semiconductor substrate on which the protective film pattern 109 is formed. It is preferable that the sacrificial conductive film 113 is the same material film as the first conductive film, for example, a doped silicon film or an undoped silicon film. Preferably, the thickness of the sacrificial conductive film 113 is about 1000 Å. Here, it is preferable that the doped or undoped silicon film is an amorphous silicon film. However, the doped or undoped silicon film can be a polysilicon film.

Figure 17A:
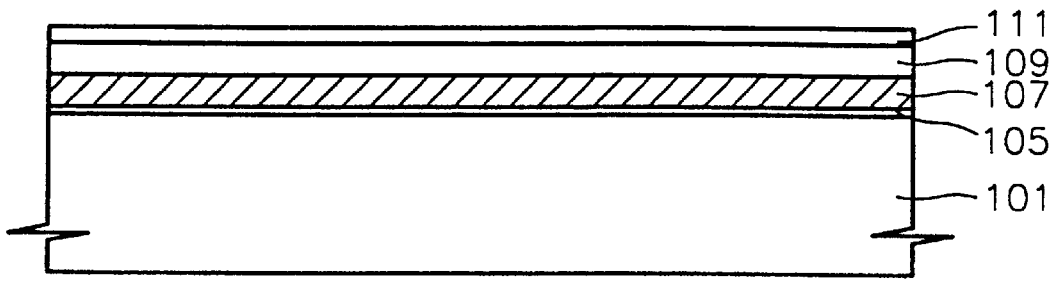
Figure 17B:
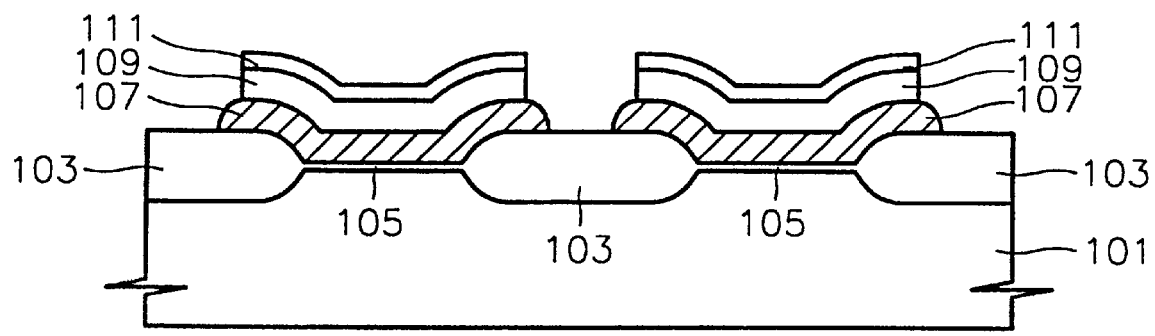
Figure 17C:
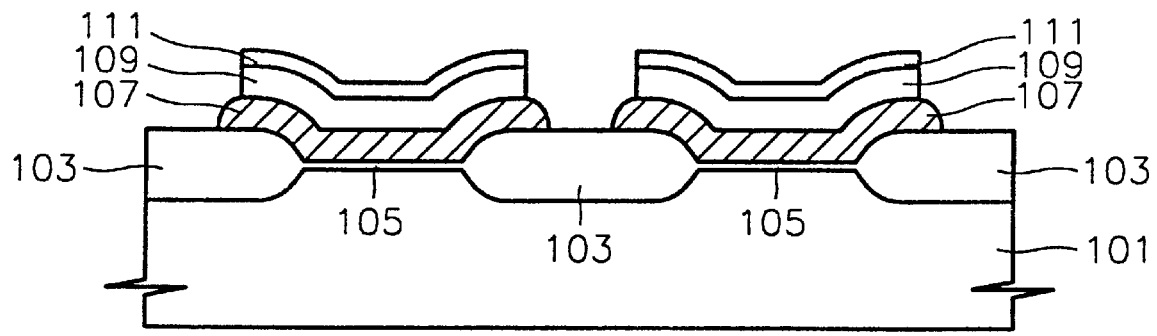

Referring to FIGS. 17A, 17B and 17C, the sacrificial conductive film 113 and the first conductive film 107 are anisotropically etched in succession, thus exposing the center of the isolation films 103 and simultaneously forming first conductive film patterns 107 each having sloped sidewalls. Here, it is preferable that the anisotropic etching is performed until the sidewalls of the protective film pattern 109 are completely exposed. Therefore, the first conductive film pattern 107 does not have sharp edges. The process for anisotropically etching the sacrificial conductive film 113 and the first conductive film 107 in succession is performed using transformer coupled plasma equipment. Here, the pressure within a chamber is 10 to 20 mTorr, and the radio frequency power supplied to upper and lower electrodes is 300 to 500W and 70 to 90W, respectively. Also, a chlorine gas Cl and a hygrogen bromide gas HBr are used as an etch gas.

Figure 18A:
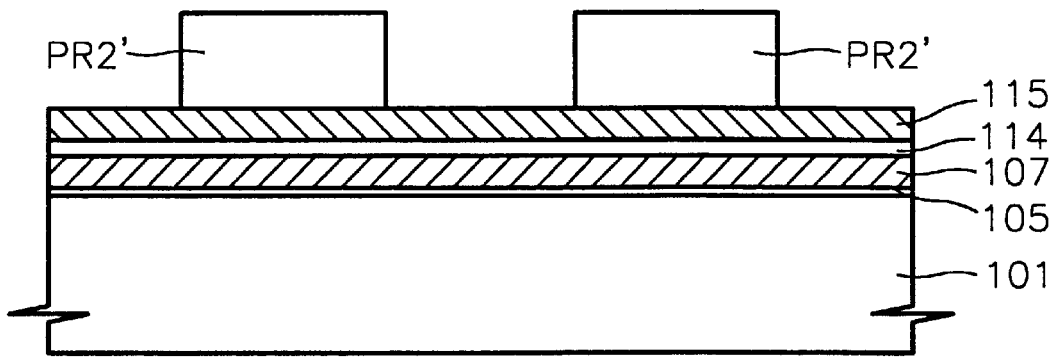
Figure 18B:
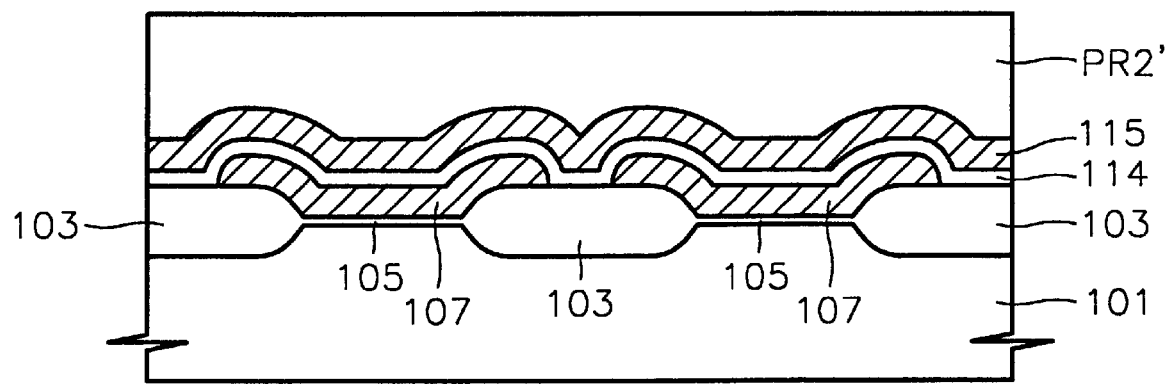
Figure 18C:
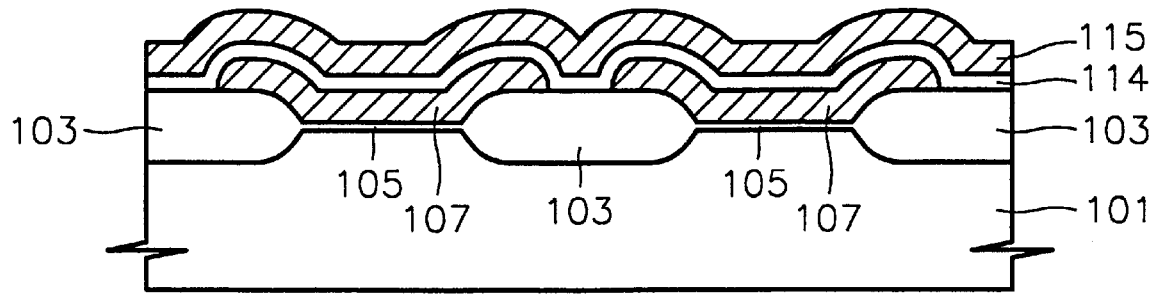

Referring to FIGS. 18A, 18B and 18C, the anti-reflective film pattern 111 and the protective film pattern 109 are removed by a wet-etching solution such as a phosphoric acid solution. At this time, when the first conductive film pattern 107 is an undoped silicon film, the first conductive film pattern 107 is doped using an ion-implantation process or the like. The first conductive film pattern 107 can be doped by ion-implantation before the anti-reflective film pattern 111 and the protective film pattern 109 are removed. An interlayer insulative film 114 and a second conductive film 115 are sequentially formed on the entire surface of the semiconductor substrate from which the anti-reflective film pattern 111 and the protective film pattern 109 were removed. The interlayer insulative film 114 and the second conductive film 115 are formed by the same method as that used in the first embodiment of the present invention. A second photoresist pattern PR2' is formed on the second conductive film 115 by the same method as that in the first embodiment of the present invention.

Figure 19A:
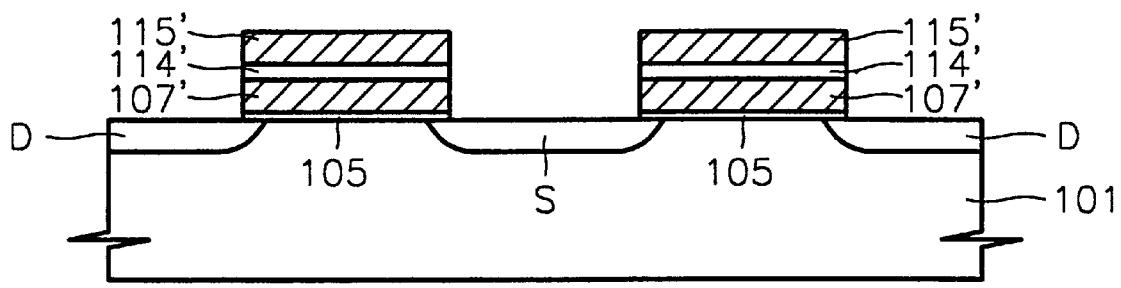
Figure 19B:
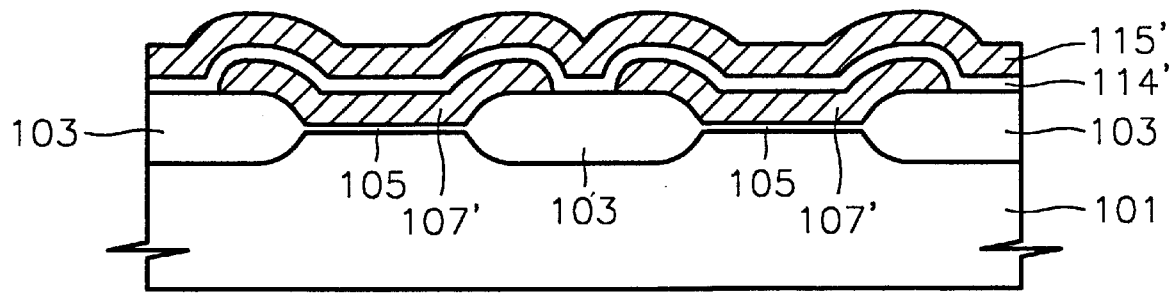
Figure 19C:
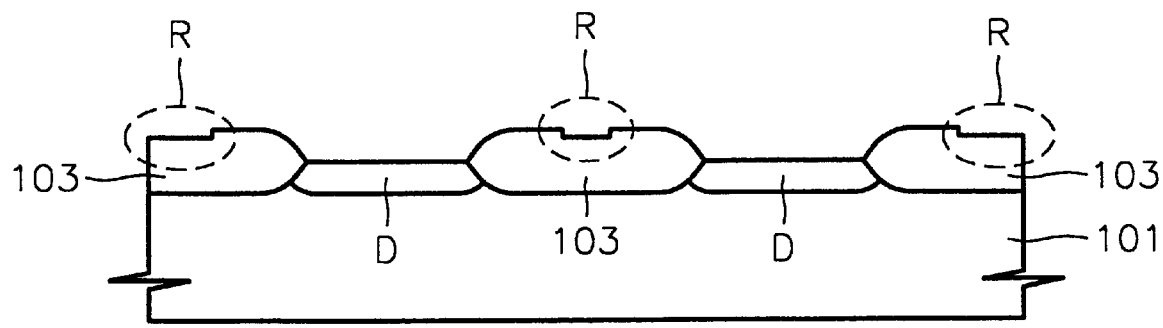

Referring to FIGS. 19A, 19B and 19C, the second conductive film 115, the interlayer insulative film 114 and the first conductive film pattern 107 are sequentially etched using the second photoresist pattern PR2' as an etch mask, thus forming a floating gate 107', an interlayer insulative film pattern 114', and a word line 115' for use as a control gate electrode. Here, the sidewalls of the floating gate maintain sloped profiles as described referring to FIGS. 17A through 17C. Thus, even when the second conductive film 115 and the interlayer insulative film 114 are not over-etched, persistence of residues of the interlayer insulative film 114 and residues of the first conductive film pattern 107 can be avoided between adjacent word lines 115'. Therefore, as shown in FIG. 19C, an etched portion of the isolation film 103 exposed between adjacent word lines 115', that is, a recessed area R can be made as shallow as possible.

Next, the second photoresist pattern PR2' is removed. Impurities having a different conductive type from the semiconductor substrate 101 are implanted into the active regions at both sides of the word line 115', thus forming a source region S and a drain region D.

According to the present invention as described above, the interval between adjacent floating gates can be smaller than the resolution limit of the photolithography, and a floating gate having a sloped sidewall profile can be formed. Accordingly, the electrical field between the floating gate and the control gate electrode can be lowered compared to the prior art where a spacer exists on both sides of a floating gate. Also, a recessed area of an isolation film can be made much shallower due to the sloped sidewall profile of the floating gate. Consequently, according to the above-described embodiments of the present invention, reliability of an interlayer insulative film between the floating gate and the control gate electrode can be significantly improved, and the isolation between adjacent cells can also be significantly improved.

The present invention is not limited to the above embodiment, and modifications and improvements may be effected by those skilled in the art.

What is claimed is:

1. A method of fabricating a cell of a flash memory device, comprising the steps of:

forming an isolation film for defining a plurality of parallel active regions on a semiconductor substrate;

forming a tunnel oxide film on the active regions;

sequentially forming, overlying the tunnel oxide film, a semiconductor film, a protective film, and a first conductive film;

etching the first conductive film above the isolation film to form a first conductive film pattern above the tunnel oxide, thereby defining a first gap above the isolation film between a pair of sidewalls in the first conductive film pattern;

forming spacers on the sidewalls of the first conductive film pattern;

etching the protective film exposed between the spacers to form a protective film pattern, thereby defining, in the protective film, a second gap, the second gap being narrower than the first gap;

etching the semiconductor film beneath the second gap to form a semiconductor film pattern, thereby exposing the center portion of the isolation film;

removing the first conductive film pattern, thereby exposing the protective film pattern;

removing the exposed protective film pattern, thereby exposing the semiconductor film pattern; and sequentially forming, overlying the semiconductor film pattern, an interlayer insulative film and a second conductive film.

2. The method of fabricating a cell of a flash memory device as claimed in claim 1, wherein the step of etching the semiconductor film beneath the second gap and the step of removing the first conductive film pattern are performed simultaneously.

3. The method of fabricating a cell of a flash memory device as claimed in claim 1, wherein the semiconductor film is an undoped polysilicon film.

4. The method of fabricating a cell of a flash memory device as claimed in claim 1, wherein the protective film is an insulative film containing a nitrogen component.

5. The method of fabricating a cell of a flash memory device as claimed in claim 4, wherein the insulative film containing a nitrogen component is selected from the group consisting of a silicon nitride film and a silicon oxynitride film.

6. The method of fabricating a cell of a flash memory device as claimed in claim 1, wherein the first conductive film is the same thickness or thinner than the semiconductor film.

7. The method of fabricating a cell of a flash memory device as claimed in claim 1, wherein the first conductive film is a doped polysilicon film.

8. The method of fabricating a cell of a flash memory device as claimed in claim 1, wherein the spacers are formed of a material selected from the group consisting of a doped silicon film and a silicon nitride film.

9. The method of fabricating a cell of a flash memory device as claimed in claim 8, wherein the doped silicon film is selected from the group consisting of a doped polysilicon film and a doped amorphous silicon film.

10. The method of fabricating a cell of a flash memory device as claimed in claim 1, wherein the exposed protective film pattern is removed by wet etching using a phosphoric acid solution.

11. The method of fabricating a cell of a flash memory device as claimed in claim 1, wherein the semiconductor film pattern is doped by ion implantation.

12. The method of fabricating a cell of a flash memory device as claimed in claim 1, wherein the interlayer insulative film is selected from the group consisting of an oxide/nitride/oxide (O/N/O) film and a nitride/oxide (N/O) film.

13. The method of fabricating a cell of a flash memory device as claimed in claim 1, wherein the second conductive film is selected from the group consisting of a doped polysilicon film and a polycide film containing a refractory metal.

14. The method of fabricating a cell of a flash memory device as claimed in claim 13, wherein the polycide film containing the refractory metal is selected from the group consisting of a tungsten polycide film and a titanium polycide film.

15. A method of fabricating a cell of a flash memory device, comprising the steps of:

forming an isolation film, for defining a plurality of parallel active regions, on a semiconductor substrate;

forming a tunnel oxide film on the active regions;

sequentially forming a first conductive film and a protective film on the entire surface of the semiconductor substrate on which the tunnel oxide film is formed;

forming a protective film pattern above the tunnel oxide film by selectively etching the protective film above the isolation film;

forming a sacrificial conductive film on the entire surface of the semiconductor substrate on which the protective film pattern is formed;

exposing the center of the isolation film and simultaneously forming a first conductive film pattern having sloped sidewalls, by over-etching the sacrificial conductive film and the first conductive film until the sidewalls and an upper surface of the protective film pattern are exposed;

removing the protective film pattern; and sequentially forming an interlayer insulative film and a second conductive film on the resultant structure.

16. The method of claim 15, wherein the first conductive film is a doped silicon film or an undoped silicon film.

17. The method of claim 15, wherein the protective film is a silicon nitride film.

18. The method of claim 15, further comprising the step of forming an anti-reflective film on the protective film.

19. The method of claim 18, wherein the anti-reflective film is a silicon oxynitride film.

20. The method of claim 15, wherein the sacrificial conductive film is a doped silicon film or an undoped silicon film.

21. A method of fabricating a cell of a flash memory device, comprising the steps of:

forming an isolation film for defining a plurality of parallel active regions on a semiconductor substrate;

forming a tunnel oxide film on the active regions;

sequentially forming, overlying the tunnel oxide film, an undoped polysilicon film, a protective film, and a first conductive film;

etching the first conductive film above the isolation film to form a first conductive film pattern above the tunnel oxide, thereby defining a first gap above the isolation film between a pair of sidewalls in the first conductive film pattern;

forming spacers on the sidewalls of the first conductive film pattern;

etching the protective film exposed between the spacers to form a protective film pattern, thereby defining, in the protective film, a second gap, the second gap being narrower than the first gap;

etching the undoped polysilicon film beneath the second gap to form an undoped polysilicon film pattern, thereby exposing the center portion of the isolation film;

removing the first conductive film pattern, thereby exposing the protective film pattern;

removing the exposed protective film pattern, thereby exposing the undoped polysilicon film pattern;

after removing the exposed protective film pattern, doping the undoped polysilicon film pattern; and sequentially forming, overlying the doped polysilicon film pattern, an interlayer insulative film and a second conductive film.

* * * * *